(12) United States Patent  (10) Patent No.: US 9,123,576 B2
Lee  (45) Date of Patent: Sep. 1, 2015

(54) SEMICONDUCTOR DEVICE AND METHOD FOR MANUFACTURING THE SAME

(75) Inventor: Seong Eun Lee, Incheon (KR)

(73) Assignee: SK HYNIX INC., Icheon (KR)

( * ) Notice: Subject to any disclaimer, the term of this patent is extended or adjusted under 35 U.S.C. 154(b) by 348 days.

(21) Appl. No.: 13/474,568

(22) Filed: May 17, 2012

(65) Prior Publication Data

US 2013/0161781 A1   Jun. 27, 2013

(30) Foreign Application Priority Data

Dec. 23, 2011  (KR) .................. 10-2011-0141359

(51) Int. Cl.
*H01L 27/108*  (2006.01)
*H01L 21/768*  (2006.01)

(52) U.S. Cl.
CPC ..... *H01L 27/10855* (2013.01); *H01L 21/76897* (2013.01); *H01L 27/10814* (2013.01); *H01L 27/10876* (2013.01)

(58) Field of Classification Search
CPC ................. H01L 27/10855; H01L 27/10814; H01L 27/10876
USPC ................. 257/296, 401, 774; 438/243, 672
See application file for complete search history.

(56) References Cited

U.S. PATENT DOCUMENTS

2009/0267231 A1* 10/2009 Kim .............................. 257/757
2011/0260238 A1* 10/2011 Kim .............................. 257/330
2012/0273919 A1* 11/2012 Im ................................ 257/522

* cited by examiner

*Primary Examiner* — Jamie C Niesz (57) ABSTRACT

A semiconductor device and a method for manufacturing the same are disclosed, which can improve device characteristics by increasing a process margin between an active region and a storage node contact. The semiconductor device includes an active region, a device isolation film formed to have a lower height than the active region, and exposing an upper part of the active region, and a barrier pattern formed at a sidewall of the exposed active region of an upper part of the device isolation film.

8 Claims, 6 Drawing Sheets

SEMICONDUCTOR DEVICE AND METHOD FOR MANUFACTURING THE SAME

CROSS-REFERENCE TO RELATED APPLICATION

The priority of Korean patent application No. 10-2011-0141359 filed on 23 Dec. 2011, the disclosure of which is hereby incorporated in its entirety by reference, is claimed.

BACKGROUND OF THE INVENTION

Embodiments of the present invention relate to a semiconductor device and a method for manufacturing the same, and more particularly to a semiconductor device including a buried gate, a storage node and a bit line, and a method for manufacturing the same.

A Dynamic Random Access Memory (DRAM) includes a plurality of unit cells, each of which includes a capacitor and a transistor. The capacitor is used to temporarily store data therein. The transistor is used to transmit data between a bit line and the capacitor in correspondence with a control signal (i.e., a word line) using the electric conductivity of a semiconductor material, which changes depending on environment. The transistor has three regions including a gate, a source and a drain, and charges between the source and the drain move in response to the control signal input to the gate. The charges between the source and the drain move through a channel region in accordance with the properties and operation of the semiconductor device.

When a general transistor is formed in a semiconductor substrate, the gate is formed in the semiconductor substrate, and impurities are doped at both sides of the gate to form the source and the drain. In this case, a region between the source and the drain under the gate becomes the channel region of the transistor. A transistor that has a horizontal channel region occupies a predetermined area of the semiconductor substrate. Reducing the overall area of a complicated semiconductor memory apparatus is difficult due to the plurality of transistors contained in the semiconductor device.

If the overall area of the semiconductor memory apparatus is reduced, the number of unit cells per wafer is increased, resulting in increased productivity. A variety of methods have been proposed to reduce the overall area of the semiconductor memory device. A representative method uses a recess gate wherein a recess is formed in a substrate and a gate is formed in the recess such that the channel region is formed along a curved surface of the recess, instead of using a conventional planar gate having a horizontal channel region. With the progress of the above recess gate, another method for burying the entirety of the gate in the recess to form a buried gate has also been proposed.

In the buried gate structure, an isolation gate in a line type is used to define a bit line contact and a storage node contact. However, the isolation gate structure increases a leakage current in a cell area more than a trench-type device isolation film.

When patterning a bit line contact in the buried gate structure employing a trench-type device isolation film, the contact hole must be patterned as a hole type and a dry etch process must be used for such patterning. If the pattern size implemented in a given process condition is reduced, a contact hole pattern may not be defined on a mask. In addition, when etching a contact hole in an active region in a subsequent etch process, the active region may not be opened. If the contact hole size is increased to prevent the above-mentioned problems, short-circuiting may occur between the contact hole and the storage node.

The storage node contact must be formed by a Self Aligned Contact (SAC) process after bit-line formation, and contact resistance unavoidably increases as a contact area between the active region and the contact is reduced.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device for improving device characteristics by increasing a process margin between an active region and a storage node contact.

In accordance with an aspect of the present invention, a semiconductor device includes first and second active regions that are adjacent to each other; a device isolation region between the first and the second active regions; a bit line contact coupled to the first active region; a storage node contact coupled to the second active region; and a barrier pattern extending from the device isolation region to a region between the first active region and the storage node contact.

A top surface of the first active region is formed at a first level, and wherein a top surface of the device isolation region is formed at a second level lower than the first level.

The barrier pattern extends up to the first level.

The storage node contact extends from the second active region over the device isolation region.

A top surface of the second active region is formed to substantially the same level as a top surface of the first active region.

A bottom of the storage node contact is lower than the first level.

The device further comprising: a third active region adjacent to the first active region; a second device isolation region between the first and the third active regions; a second storage node contact coupled to the third active region; and a second barrier pattern extending from the second device isolation region to a region between the first active region and the second storage node contact.

In accordance with an aspect of the present invention, first and second active regions that are adjacent to each other; a device isolation region provided between the first and the second active regions, wherein the device isolation region includes an upper step and a lower step, wherein a top surface of the upper step is level with a top surface of the first active region; a bit line contact coupled to the first active region; and a storage node contact coupled to the second active region and further coupled to the lower step of the device isolation region.

In accordance with another aspect of the present invention, a method for manufacturing a semiconductor device comprising: forming a device isolation trench between first and second active regions; filling the device isolation trench with an insulation material; and etching the insulation material to form a device isolation film and a barrier pattern, wherein the barrier pattern is stepped up from the device isolation film and formed at a sidewall of the first active region.

The method further comprising: providing a bit line contact coupled to the first active region; and providing a storage node contact coupled to the second active region, wherein the barrier pattern is provided between the bit line contact and the storage node contact.

The step of etching the insulation material includes: forming a mask pattern over the first active region and over a part of the insulation material in the device isolation trench that is adjacent to the first active region; and etching the insulation material using the mask pattern as an etch mask to form the device isolation film and the barrier pattern stepped up from the device isolation film.

The step of forming the mask pattern further includes: forming a negative photoresist film over an entire surface of the semiconductor substrate including the first and the second active regions and the insulation material in the device isolation trench; and patterning the negative photoresist film by performing an exposure process using an exposure mask to form the mask pattern.

The method further comprising: after formation of the barrier pattern, forming a first interlayer insulation film over an entire surface of the semiconductor substrate including the first and the second active regions, the device isolation film, and the barrier pattern; forming a bit line contact hole exposing the active region by etching the first interlayer insulation film; and forming a bit line contact by filling the bit line contact hole with conductive material.

The method further comprising: forming a bit line coupled to the bit line contact.

The method further comprising: forming a second interlayer insulation film over the first interlayer insulation film including the bit line; etching the second interlayer insulation film and the first interlayer insulation film to form a storage node contact hole exposing the second active region; and forming a storage node contact by filling the storage node contact hole with conductive material.

In accordance with another aspect of the present invention, a method for manufacturing a semiconductor device, comprising: providing first and second active regions adjacent to each other; providing a device isolation region between the first and the second active regions, wherein the device isolation region 100 includes an upper step and a lower step, and wherein the upper step extends toward the first active region, and the lower step extends toward the second active region.

The method further comprising: providing a bit line contact coupled to the first active region; and providing a storage node contact coupled to the second active region and further coupled to the lower step of the device isolation region.

A top surface of the upper step is substantially level with a top surface of the first active region, and wherein a top surface of the lower step is substantially level with a top surface of the first active region.

A top surface of first active region is formed to a higher level than a top surface of the lower step of the device isolation region.

It is to be understood that both the foregoing general description and the following detailed description of the present invention are exemplary and explanatory and are intended to provide further explanation of the invention as claimed.

BRIEF DESCRIPTION OF THE DRAWINGS

FIGS. 1(i) and (ii) are a plan view and a cross-sectional view illustrating a semiconductor device according to an embodiment of the present invention.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

Figure 1:
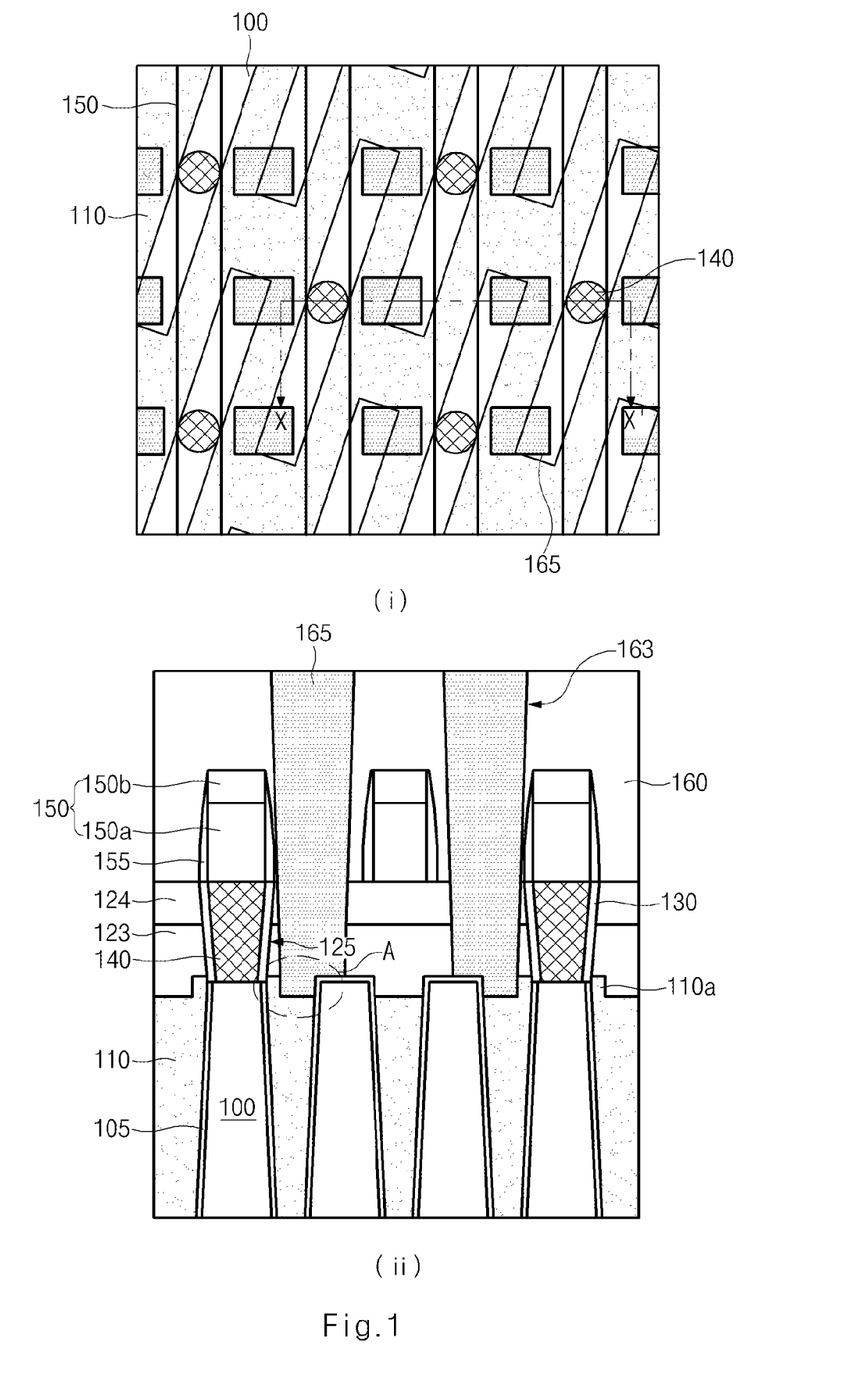

FIG. 1 shows a plan view and a cross-sectional view illustrating a semiconductor device according to an embodiment of the present invention. In more detail, FIG. 1(ii) is a cross-sectional view illustrating the semiconductor device taken along the line X-X' of FIG. 1(i).

Figure 2A:
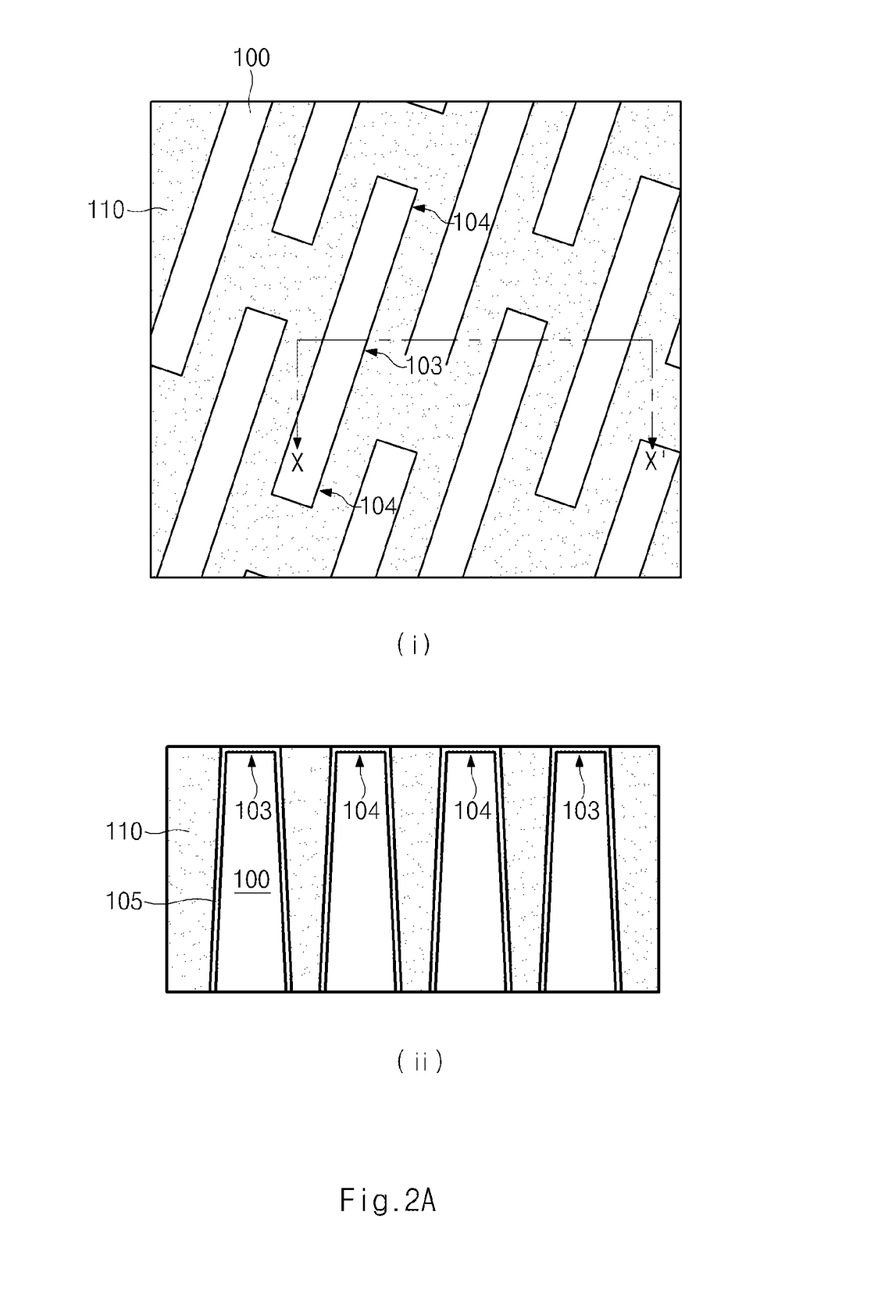
FIGS. 2A to 2E are plan views and cross-sectional views illustrating a method for manufacturing a semiconductor device according to an embodiment of the present invention.

Referring to FIG. 1, an active region 100 and a device isolation film 110 are formed over a semiconductor substrate. As illustrated in FIG. 2A, the active region 100 is formed as a bar type, and the active region 100 includes a bit line contact region 103 and a storage node contact region 104. The bit line contact region 103 is located at the center of the active region 100. The storage node contact region 104 is located at both ends of the active region 100. A liner insulation film 105 may also be formed over the active region 100. In this embodiment, the liner insulation film 105 includes an oxide film.

Referring again to FIG. 1, the device isolation film 110 includes a nitride film, and an upper surface of the device isolation film 110 is lower than an upper surface of the active region 100. In this embodiment, a barrier pattern 110a is formed at a sidewall of the active region 100 in the bit line contact region 103. The barrier pattern 110a is formed by patterning the device isolation film 110 adjacent to the active region 100 in the bit line contact region 103. Patterning the device isolation film 110 results in a step difference 'A' in the device isolation film 110, thus forming the barrier pattern 110a. The barrier pattern 110a may be formed to have the same or higher height as an upper surface of the active region 100. Since the barrier pattern 110a is formed by patterning the device isolation film 110, it is formed of the same materials as the device isolation film 110. For example, the barrier pattern 110a may include a nitride film.

In addition, a bit line contact 140 is formed to be coupled to the active region 100 in the bit line contact region 103. In the process for forming the bit line contact 140, a barrier metal layer 130 is deposited at a sidewall of a bit line contact hole 125 formed by etching a first interlayer insulation film 123 and a second interlayer insulation film 124, and a conductive material such as polysilicon is buried in the bit line contact hole 125, resulting in formation of the bit line contact 140. A bit line 150 coupled to the bit line contact 140 is formed over the second interlayer insulation film 124. The bit line 150 is formed to have a laminated structure of a bit line conductive material 150a and a bit line hard mask 150b. A spacer 155 is further formed at a sidewall of the bit line. The spacer includes a nitride film. Preferably, the spacer 155 may be formed to prevent the bit line 150 from being damaged in a subsequent process for forming the storage node contact hole.

In addition, a storage node contact 165 is coupled to the storage node contact region 104 of the active region 100. In the process for forming the storage node contact 165, a storage node contact hole 163 is formed by etching a third interlayer insulation film 160 (formed over the bit line 150 and the second interlayer insulation film 124), the second interlayer insulation film 124 and the first interlayer insulation film 123, and a conductive material such as polysilicon is buried in the storage node contact hole 163, resulting in formation of the storage node contact 165. A process for extending the bottom part of the storage node contact hole 163 is also performed to increase an interface area between the storage node contact 165 and the active region 100. Since the active region 100 in the bit line contact region 103 is protected by the barrier pattern 110a, the active region 100 in the bit line contact region 103 and the bit line contact 140 can be protected from damage that might otherwise occur when the storage node contact hole 163 is formed in a subsequent process. Thus, although a process for extending the storage node contact hole 163 has been performed, the active region 100 in the bit line contact region is not exposed. As a result, short-circuiting between the active region and the storage node contact can be prevented in the resultant structure.

Figure 2B:
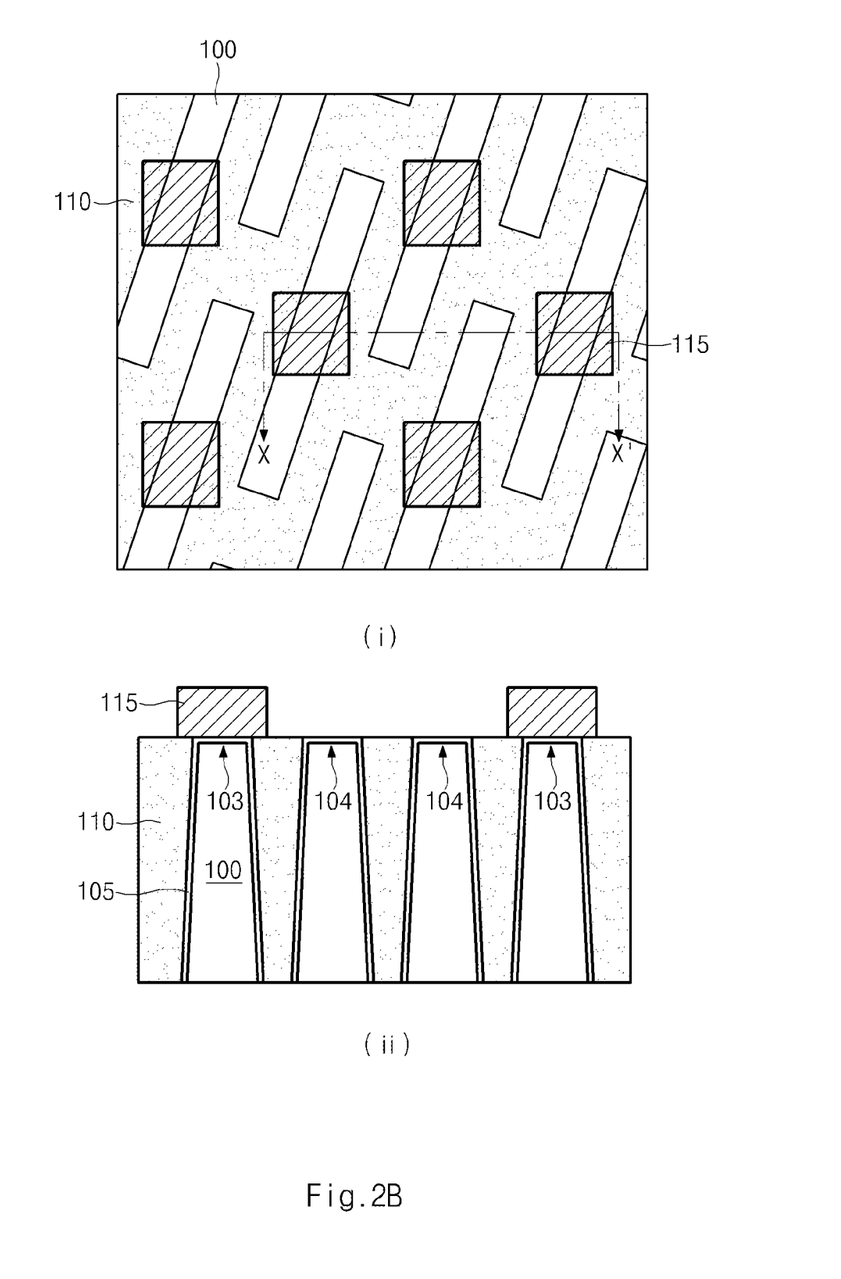
Figure 2C:
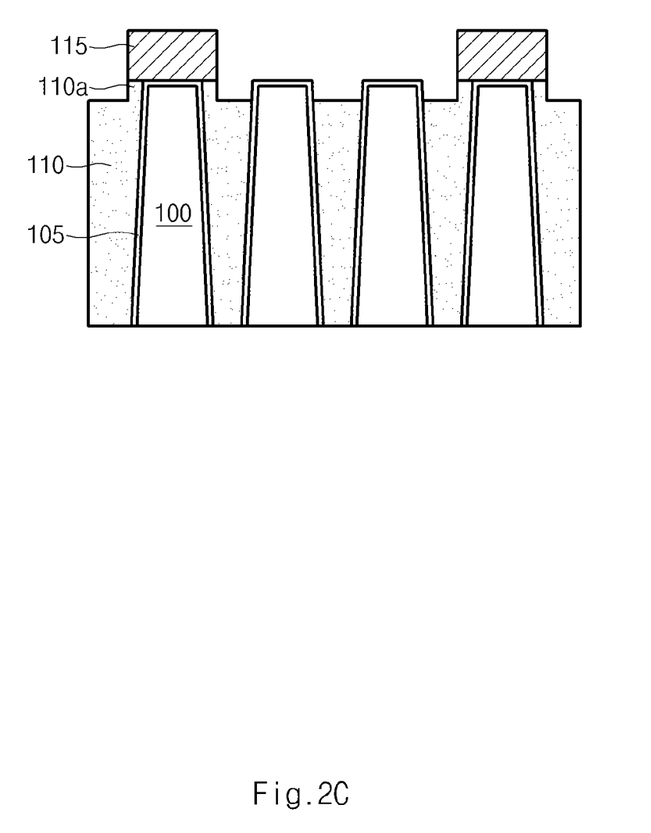
Figure 2D:
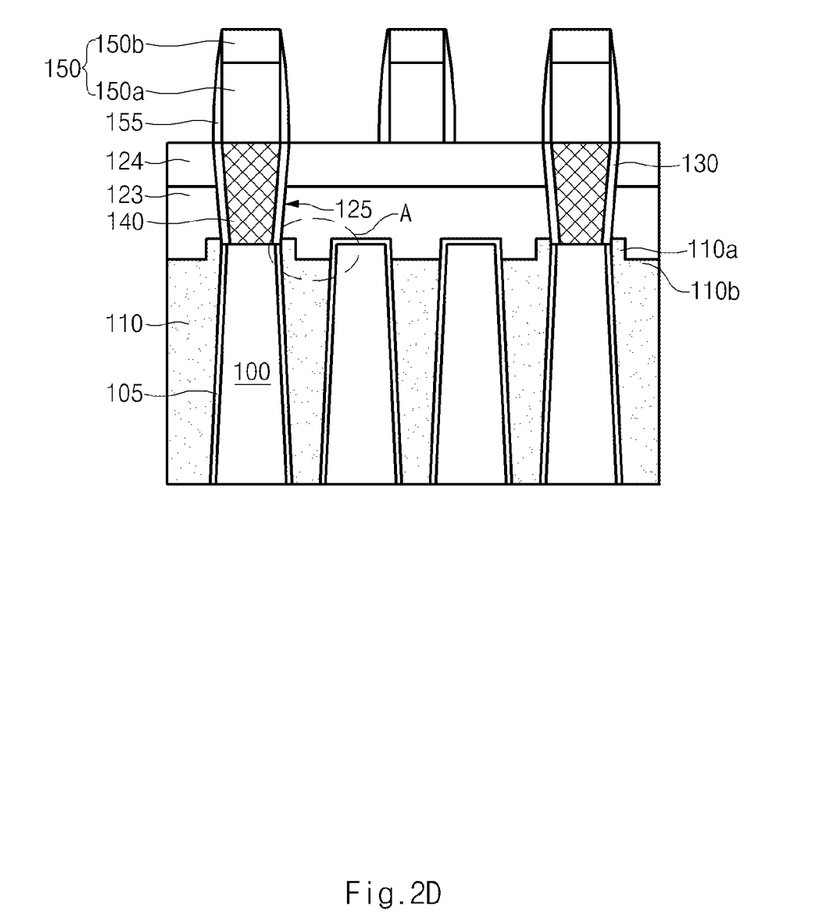
Figure 2E:
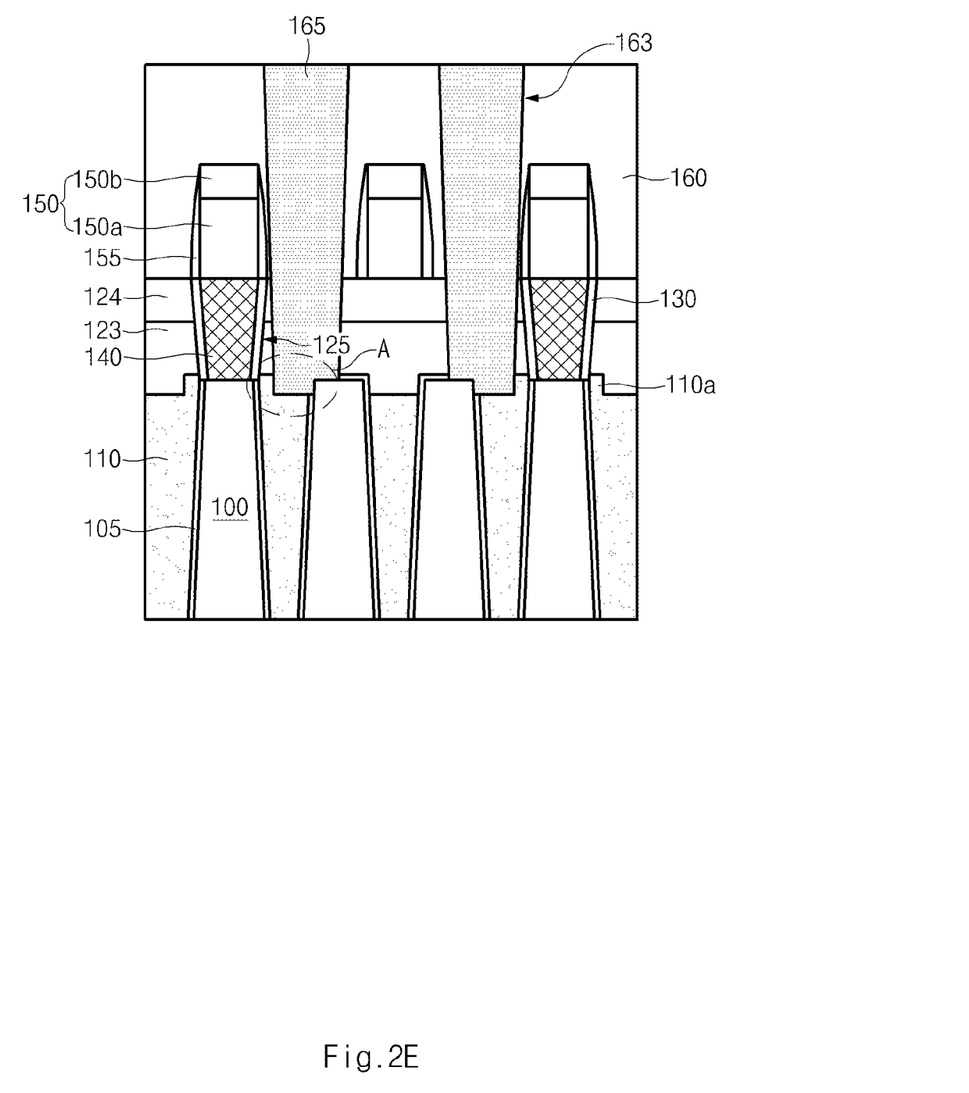

FIGS. 2A to 2E are plan views and cross-sectional views illustrating a method for manufacturing a semiconductor device according to an embodiment of the present invention. FIG. 2A(ii) is a cross-sectional view illustrating the semiconductor device taken along the line X-X' of FIG. 2A(i), and FIG. 2B(ii) is a cross-sectional view illustrating the semiconductor device taken along the line X-X' of FIG. 2B(i). FIG. 2C(ii) is a cross-sectional view illustrating the semiconductor device taken along the line X-X' of FIG. 2C(i), and FIG. 2D(ii) is a cross-sectional view illustrating the semiconductor device taken along the line X-X' of FIG. 2D(i). FIG. 2E is a cross-sectional view illustrating the semiconductor device Referring to FIG. 2A, a mask pattern (not shown) defining the active region 100 is formed over the semiconductor substrate. A device isolation trench is formed by etching the semiconductor substrate using the mask pattern (not shown) as an etch mask. A liner insulation film 105 is formed over the entire surface of the semiconductor substrate including the device isolation trench. The liner insulation film 105 may be an oxide film formed by an oxidation process. Thereafter, a device isolation insulation film is formed over the entire surface of the semiconductor substrate over which the liner insulation film 105 is formed, such that the device isolation trench is completely buried with the device isolation insulation film. The device isolation insulation film may include a nitride film. After that, a planarization process is performed on the device isolation insulation film to form the device isolation film 110. In an embodiment, an etchback or Chemical Mechanical Polishing (CMP) process may be applied to the planarization process. Preferably, the planarization process may be performed until the liner insulation film 105 formed over the active region 100 is exposed.

Referring to FIG. 2B, a mask pattern 115 is formed over a bit line contact region 103 of the active region 100. In this embodiment, one active region 100 includes one bit line contact region 103 and two storage node contact regions 104. However, the present invention is not limited thereto. In this embodiment, the bit line contact region 103 is located in the center portion of the active region 100, and the storage node contact region 104 is located at both ends of the active region 104. The mask pattern 115 is formed to such a size to sufficiently cover the bit line contact region 103 of the active region 100Preferably, the mask pattern 115 extends over a portion of the adjacent device isolation film 110, as shown in FIG. 2B(i). The mask pattern 115 may be formed of a negative photoresist film, and may be formed through an exposure process using an exposure mask for a bit line contact. After the exposure process using the above-mentioned bit line contact exposure mask is carried out after formation of the negative photoresist film, the bit line contact hole part may be formed in a pattern, such that the mask pattern 115 is formed as shown in FIG. 2B. However, a method for forming the mask pattern 115 is not limited to use the negative photoresist film.

Referring to FIG. 2C, the device isolation film 110 is etched to a predetermined depth, using the mask pattern 115 as an etch mask, to form a device isolation region having a upper step and a lower step. The upper step extends to a sidewall of the active region 100 in the bit line contact region 103 to form a barrier pattern 110a. In this embodiment, only the device isolation film 110 is etched due to a difference in the etch selection ratio of the device isolation film 110 formed of a nitride material and the active region 100 formed of a silicon material. However, material forming of the device isolation film 110 and the active region 100 are not limited to nitride material and silicon material, respectively.

Referring to FIG. 2D, the mask pattern 115 is removed. After that, a first interlayer insulation film 123 and a second interlayer insulation film 124 are formed over the entire surface including the active region 100 and the device isolation film 110. The first interlayer insulation film 123 may be formed of a nitride film, and the second interlayer insulation film 124 may be formed of an oxide film. A mask pattern (not shown) for opening the bit line contact region 103 is formed over the second interlayer insulation film 124. The second interlayer insulation film 124 and the first interlayer insulation film 123 are etched using the mask pattern (not shown) as an etch mask, such that the bit line contact hole 125 is formed to expose the active region 100 in the bit line contact region 103.

After removing the mask pattern (not shown), a barrier metal layer 130 is formed over the second interlayer insulation film 124 exposed by the bit line contact hole 125. The barrier metal layer 130 is then etched back, such that the barrier metal layer 130 forms a spacer pattern at a sidewall of the bit line contact hole 125. The barrier metal layer 130 may be formed of any one of a titanium (Ti) film, a titanium nitride (TiN) film, and a combination thereof, but is not limited thereto. A conductive material, such as polysilicon, is buried in the bit line contact hole 125 in which the barrier metal layer 130 is formed, resulting in formation of the bit line contact 140. A bit line conductive material 150a and a bit line hard mask 150b are sequentially deposited over the second interlayer insulation film 124 including the bit line contact 140 to form a bit line 150. A bit line spacer 155 is formed at a sidewall of the bit line 150. The bit line spacer 155 may be formed before or after the bit line 150 is formed.

Referring to FIG. 2E, a third interlayer insulation film 160 is formed over the second interlayer insulation film 124 including the bit line 150. A mask pattern (not shown) for defining the storage node contact hole is formed over the third interlayer insulation film 160.

Thereafter, the third interlayer insulation film 160, the second interlayer insulation film 124, and the first interlayer insulation film 123 are etched using the mask pattern (not shown) as an etch mask, such that the storage node contact hole 163 is formed to expose the active region 100 where the storage node contact region 104 is formed.

Thereafter, a sidewall of the third interlayer insulation film 160 exposed by the storage node contact hole 163, a sidewall of the second interlayer insulation film 124, and a sidewall of the first interlayer insulation film 123 are further etched to enlarge the area of the bottom part of the storage node contact hole 163. The widening process may be carried out by a wet etching process. Thereafter, a conductive material such as polysilicon is buried in the storage node contact hole 163, resulting in formation of the storage node contact plug 165. In this case, according to embodiments of the present invention, the barrier pattern 110a formed at a sidewall of the active region 100 in the bit line contact region 103 forms a barrier between the active region 100 including the bit line contact 140 and an adjacent device isolation region 110. As a result, even if the widening process for extending the storage node contact hole 163 is excessively performed, an embodiment of the present invention can prevent the occurrence of short-circuiting between the active region 100 and the storage node contact plug 165.

As is apparent from the above description, the semiconductor device and the method for manufacturing the same according to embodiments of the present invention have the following effects. The barrier pattern 110a is formed at a sidewall of the active region of the bit line contact region, such that the embodiment can prevent short-circuiting between the active region and the storage node contact from occurring in the widening process after formation of the storage node contact hole. Therefore, a process margin is increased. Accordingly, the area of the bottom part of the storage node contact hole can be increased, thus, reducing contact resistance.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   first and second active regions that are adjacent to each other;
   a device isolation region disposed between the first and the second active regions and including a barrier pattern, wherein the barrier pattern is disposed laterally on sidewalls of an upper portion of the first active region;
   a bit line contact coupled to the first active region; and a storage node contact coupled to the second active region,
   wherein the device isolation region is disposed in a substrate, and
   wherein the device isolation region is formed of a single device isolation film, and the barrier pattern is a protruding portion of the device isolation film.

2. The semiconductor device of claim 1,
   wherein a top surface of the first active region is disposed at a first level, and
   wherein a top surface of the device isolation region is disposed at a second level lower than the first level.

3. The semiconductor device of claim 2,
   wherein the barrier pattern extends up to the first level.

4. The semiconductor device of claim 1,
   wherein the storage node contact extends from the second active region over the device isolation region.

5. The semiconductor device of claim 2,
   wherein a top surface of the second active region is disposed at substantially the same level as the top surface of the first active region.

6. The semiconductor device of claim 2,
   wherein a bottom of the storage node contact is lower than the first level.

7. The semiconductor device of claim 1, the device further comprising:
   a third active region adjacent to the first active region;
   a second device isolation region between the first and the third active regions;
   a second storage node contact coupled to the third active region; and
   a second barrier pattern extending from the second device isolation region to a region between the first active region and the second storage node contact.

8. A semiconductor device comprising:
   first and second active regions that are adjacent to each other;
   a device isolation region provided between the first and the second active regions, wherein the device isolation region includes an upper step and a lower step, wherein a top surface of the upper step is level with a top surface of the first active region, the upper step being proximate to the first active region, the lower step being proximate to the second active region;
   a bit line contact coupled to the first active region; and
   a storage node contact coupled to the second active region and further coupled to the lower step of the device isolation region,
   wherein the device isolation region is disposed in a substrate and formed of a single device isolation film.

* * * * *